(12) United States Patent
Cohen et al.

(10) Patent No.: US 12,263,693 B2
(45) Date of Patent: Apr. 1, 2025

(54) PATTERN TRANSFER SHEETS AND METHODS EMPLOYING A RELEASING LAYER AND/OR PASTE MIXTURES

(71) Applicant: Wuhan Dr Laser Technology Corp., Ltd., Wuhan (CN)

(72) Inventors: Eyal Cohen, Kfar-Saba (IL); Natali Cohen, Ramat Gan (IL)

(73) Assignee: Wuhan DR Laser Technology Corp, . LTD, Wuhan (CN)

( * ) Notice: Subject to any disclaimer, the term of this patent is extended or adjusted under 35 U.S.C. 154(b) by 75 days.

(21) Appl. No.: 17/971,689

(22) Filed: Oct. 24, 2022

(65) Prior Publication Data
US 2023/0129519 A1    Apr. 27, 2023

(30) Foreign Application Priority Data
Oct. 22, 2021  (CN) .......................... 202111233805.7

(51) Int. Cl.
  *B41M 5/46* (2006.01)
  *B41M 5/382* (2006.01)
  (Continued)

(52) U.S. Cl.
  CPC ........ *B41M 5/465* (2013.01); *B41M 5/38214* (2013.01); *B41M 5/392* (2013.01);
  (Continued)

(58) Field of Classification Search
  CPC .... B41M 5/38214; B41M 5/392; B41M 5/41; B41M 5/44; B41M 5/465; B41M 2205/08;
  (Continued)

(56) References Cited

U.S. PATENT DOCUMENTS

| | | |
|---|---|---|
| 9,616,524 B2 | 4/2017 | Matusovsky et al. |
| 9,750,141 B2 | 8/2017 | Noy |
| | (Continued) | |

FOREIGN PATENT DOCUMENTS

| | | |
|---|---|---|
| CN | 104647885 | 5/2013 |
| CN | 103730542 | 1/2016 |
| | (Continued) | |

OTHER PUBLICATIONS

J. Lossen, Pattern Transfer Printing (PTP™) for c—Si solar cell metallization, 5th Workshop on Metallization for Crystalline Silicon Solar Cells, Energy Procedia 67 (2015) 156-162, Science Direct, Elsevier.
(Continued)

*Primary Examiner* — Gerard Higgins
(74) *Attorney, Agent, or Firm* — PEARL COHEN ZEDEK LATZER BARATZ LLP

(57) ABSTRACT

Pattern transfer sheets and methods are provided for printing paste patterns (e.g., thin fingers) with a high aspect ratio and for increasing throughput in pattern transfer printing. Trenches in the pattern transfer sheets, that are configured to be filled with printing paste and to enable releasing the printing paste from the trenches onto a receiving substrate upon illumination by a laser beam—are coated internally by a coating configured to disintegrate upon the illumination. The coating is configured to enhance the releasing of the paste—increasing throughput and printing accuracy. The receiving substrate may be cleaned after paste deposition by removing disintegration products of the coating therefrom. Alternatively or complementarily, laser absorbing dye may be mixed into the printing paste to facilitate its release from the trenches.

17 Claims, 9 Drawing Sheets
(5 of 9 Drawing Sheet(s) Filed in Color)

(51) Int. Cl.
    *B41M 5/392*     (2006.01)
    *B41M 5/41*     (2006.01)
    *B41M 5/44*     (2006.01)
    *H05K 3/20*     (2006.01)

(52) U.S. Cl.
    CPC ............... *B41M 5/41* (2013.01); *B41M 5/44* (2013.01); *H05K 3/207* (2013.01); *B41M 2205/08* (2013.01); *B41M 2205/30* (2013.01)

(58) Field of Classification Search
    CPC ... B41M 2205/30; H05K 1/095; H05K 3/207; H05K 2203/107
    See application file for complete search history.

(56) References Cited

U.S. PATENT DOCUMENTS

| | | |
|---|---|---|
| 10,973,129 B2 | 4/2021 | Landa et al. |
| 2004/0110321 A1 | 6/2004 | Oda et al. |
| 2006/0189113 A1 | 8/2006 | Vanheusden et al. |
| 2007/0281241 A1* | 12/2007 | Wolk ..................... B41M 5/465 430/200 |
| 2008/0115833 A1 | 5/2008 | Carlson |
| 2009/0047597 A1* | 2/2009 | Felder ..................... B41M 5/46 427/145 |
| 2010/0044103 A1 | 2/2010 | Moxley et al. |
| 2011/0097550 A1 | 4/2011 | Matusovsky et al. |
| 2012/0111401 A1 | 5/2012 | Kang et al. |
| 2012/0161081 A1 | 6/2012 | Kleine Jaeger et al. |
| 2015/0027524 A1 | 1/2015 | Seyedmohammadi et al. |
| 2017/0268100 A1 | 9/2017 | Hendriks et al. |
| 2018/0015671 A1* | 1/2018 | Sandstrom .............. C23C 14/56 |
| 2019/0019736 A1 | 1/2019 | Schrauben et al. |
| 2020/0211729 A1 | 7/2020 | Chandrasekaran et al. |
| 2021/0136923 A1 | 5/2021 | Landa et al. |
| 2023/0019668 A1 | 1/2023 | Noy et al. |

FOREIGN PATENT DOCUMENTS

| | | |
|---|---|---|
| CN | 216069167 U | 3/2022 |
| CN | 216139714 U | 3/2022 |
| CN | 115489196 | 12/2022 |
| CN | 115610127 A | 1/2023 |
| DE | 19746174 | 7/1999 |
| EP | 2660352 | 11/2013 |
| IL | 294060 | 1/2023 |
| JP | H0716935 | 7/1995 |
| JP | 2016171013 | 9/2016 |
| KR | 10-2012-0045067 | 5/2012 |
| WO | WO 2009/143792 | 12/2009 |
| WO | WO 2018/020479 | 2/2018 |
| WO | WO 2018/020481 | 2/2018 |
| WO | WO 2018/020483 | 2/2018 |

OTHER PUBLICATIONS

Search Report dated Mar. 16, 2023 for European Application No. EP22203363.1.

* cited by examiner

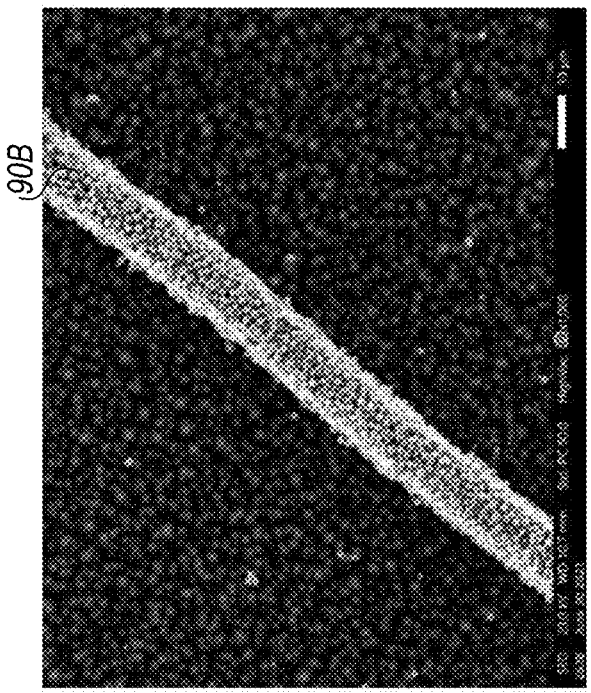
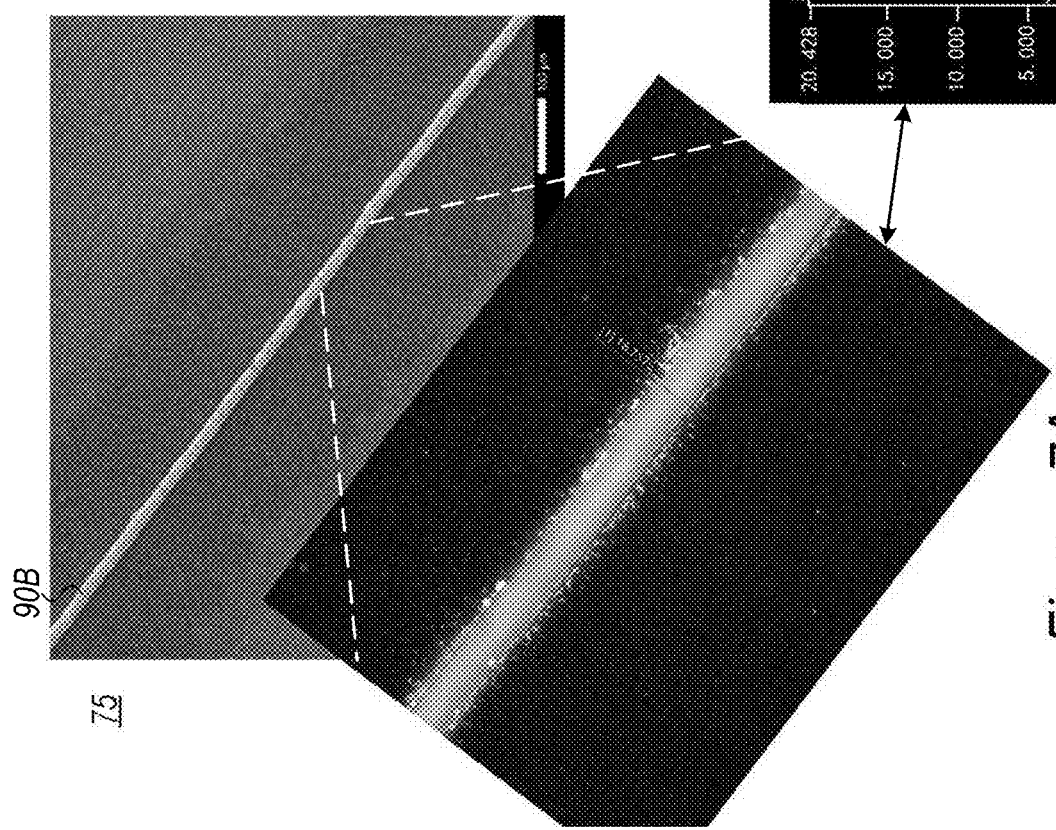
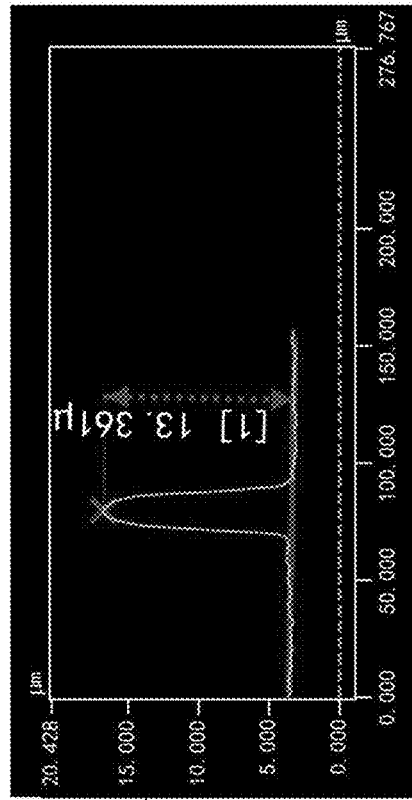
Figure 7B
Figure 7A

PATTERN TRANSFER SHEETS AND METHODS EMPLOYING A RELEASING LAYER AND/OR PASTE MIXTURES

CROSS REFERENCE TO RELATED APPLICATIONS

This application claims priority from Chinese Application No. 202111233805.7, filed on Oct. 22, 2021, which is incorporated herein by reference in its entirety.

BACKGROUND OF THE INVENTION

1. Technical Field

The present invention relates to the field of transfer printing, and more particularly, to improvements of paste release.

2. Discussion of Related Art

U.S. Pat. No. 9,616,524, which is incorporated herein by reference in its entirety, teaches a method of depositing a material on a receiving substrate, the method comprising: providing a source substrate having a back surface and a front surface, the back surface carrying at least one piece of coating material; providing a receiving substrate positioned adjacent to the source substrate and facing the coating material; and radiating light towards the front surface of the source substrate, to remove at least one piece of the coating material from the source substrate and deposit said removed at least one piece onto the receiving substrate as a whole.

Lossen et al. (2015), Pattern Transfer Printing (PTP™) for c-Si solar cell metallization, 5$^{th}$ Workshop on Metallization for Crystalline Silicon Solar Cells, Energy Procedia 67:156-162, which is incorporated herein by reference in its entirety, teaches pattern transfer printing (PTP™) as a non-contact printing technology for advanced front side metallization of c-Si PV solar cells, which is based on laser-induced deposition from a polymer substrate.

WIPO Publication No. 2018020479, which is incorporated herein by reference in its entirety, teaches applying an electrical conductor to a solar cell, by providing a flexible membrane with a pattern of grooves formed on a first surface thereof, loading the grooves with a composition comprising conductive particles. Once the membrane is loaded, the grooved first surface of the membrane is brought into contact with a front or/and back of solar cell. A pressure is then applied between the solar cell and the membrane so that the composition loaded to the grooves adheres to the solar cell. The membrane and the solar cell are separated and the composition in the groove is left on the solar cell surface. The electrically conductive particles in the composition are then sintered or otherwise fused to form a pattern of electrical conductor on the solar cell, the pattern corresponding to the pattern formed in the membrane.

SUMMARY OF THE INVENTION

The following is a simplified summary providing an initial understanding of the invention. The summary does not necessarily identify key elements nor should be used to limit the scope of the invention, but merely serves as an introduction to the following description.

One aspect of the present invention provides a pattern transfer sheet comprising a plurality of trenches arranged in a specified pattern and configured to be filled with printing paste and to enable releasing the printing paste from the trenches onto a receiving substrate upon illumination by a laser beam, wherein the trenches are coated internally by a coating configured to disintegrate upon the illumination, to enhance the releasing of the paste.

One aspect of the present invention provides a pattern transfer method comprising coating, internally, a plurality of trenches of a pattern transfer sheet configured to be filled with printing paste and to enable releasing the printing paste from the trenches onto a receiving substrate upon illumination by a laser beam, wherein the coating is configured to disintegrate upon the illumination, to enhance the releasing of the paste, and optional cleaning the receiving substrate by removing disintegration products of the coating therefrom.

One aspect of the present invention provides a paste for use in a pattern transfer process, by filling the paste into a plurality of trenches in a polymer pattern transfer sheet which are arranged in a specified pattern, and consecutively releasing the paste from the trenches onto a receiving substrate upon illumination by a laser beam, wherein: the illumination is in near infrared (NIR), the paste comprises a releasing material configured to enhance the releasing of the paste from the trenches, and the releasing material comprises at least one NIR absorbing dye comprising at least one of: a Diimonium ionic complex, a Dithiolene complex, phthalocyanine, derivatives, salts and/or combinations thereof.

One aspect of the present invention provides a printing paste comprising, by weight, 50-90% of silver particles, 1-10% of solvent, 1-5% of glass frits, 1-5% of polymeric binder, 1-5% of additives and 1-7% of NIR absorbing dye, wherein the solvent has the solubility parameters: $\delta D$ between 14 and 17 $\sqrt{MPa}$, $\delta P$ between 4 and 11 $\sqrt{MPa}$, and $\delta H$ between 7 and 11 $\sqrt{MPa}$, and the NIR absorbing dye comprises at least one of: a Diimonium ionic complex, a Dithiolene complex, phthalocyanine, derivatives, or salts and/or combinations thereof.

One aspect of the present invention provides a printing paste comprising, by weight, 50-90% of silver particles, 1-5% of glass frits, 1-5% of polymeric binder, 1-5% of additives and 0.1-1% of NIR absorbing dye, wherein the NIR absorbing dye comprises at least one of: a Diimonium ionic complex, a Dithiolene complex, cyanine, phthalocyanine, derivatives, or salts and/or combinations thereof.

One aspect of the present invention provides a pattern transfer system, wherein the pattern transfer system performs laser transfer by using disclosed pattern transfer sheets and/or by using disclosed pattern transfer methods and/or by using disclosed paste compositions.

One aspect of the present invention enables printing narrower paste patterns with higher aspect ratio than is currently possible, and/or using a smaller amount of energy to release the paste.

These, additional, and/or other aspects and/or advantages of the present invention are set forth in the detailed description which follows; inferable from the detailed description; and/or learnable by practice of the present invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 1 is a high-level schematic cross-section illustration of a pattern transfer sheet, according to some embodiments of the invention.

FIGS. 2A and 2B are high-level schematic side-view illustrations of a pattern transfer process utilizing a releasing layer, according to some embodiments of the invention.

FIGS. 3A and 3B are high-level schematic side-view illustrations of a releasing layer coating process, according to some embodiments of the invention.

FIG. 4A is a high-level flowchart illustrating a method of monitoring pattern transfer printing, according to some embodiments of the invention.

FIG. 4B is a high-level schematic illustration of options for using the dyes in the method and in the PTP system, according to some embodiments of the invention.

FIGS. 5A-5C illustrate the effect of using the coating on the quality of printing and on the residual amount of debris left on the receiving substrate, according to some embodiments of the invention.

FIGS. 6A and 6B illustrate the effect of substrate cleaning by high temperature heat treatment, according to some embodiments of the invention.

FIGS. 7A and 7B illustrate the ability to produce extremely thin lines using the coating, according to some embodiments of the invention.

Figure 8:
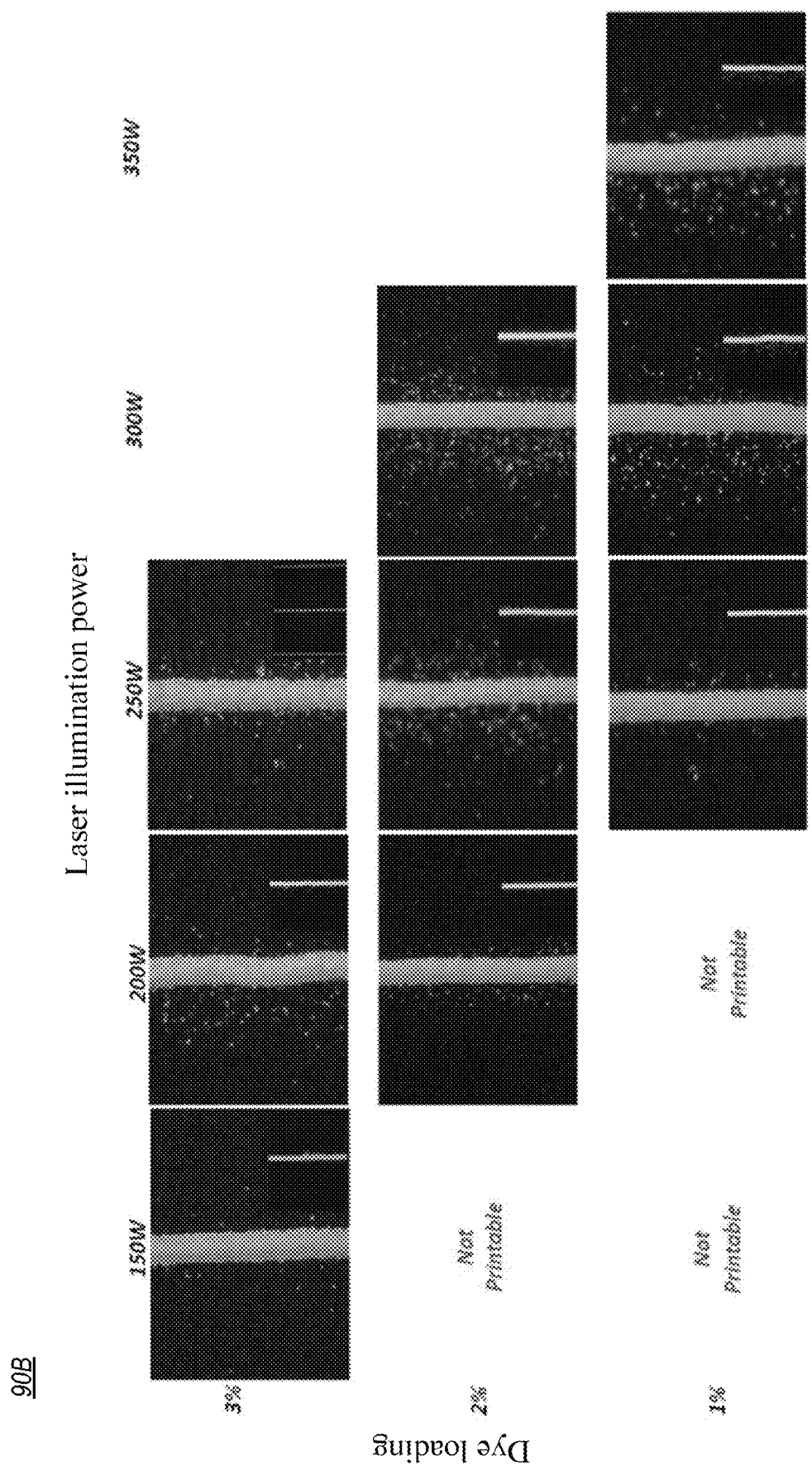

FIG. 8 provides illustrations of fingers printed with dye-mixed paste, under different parameter values, according to some embodiments of the invention.

Figure 9:
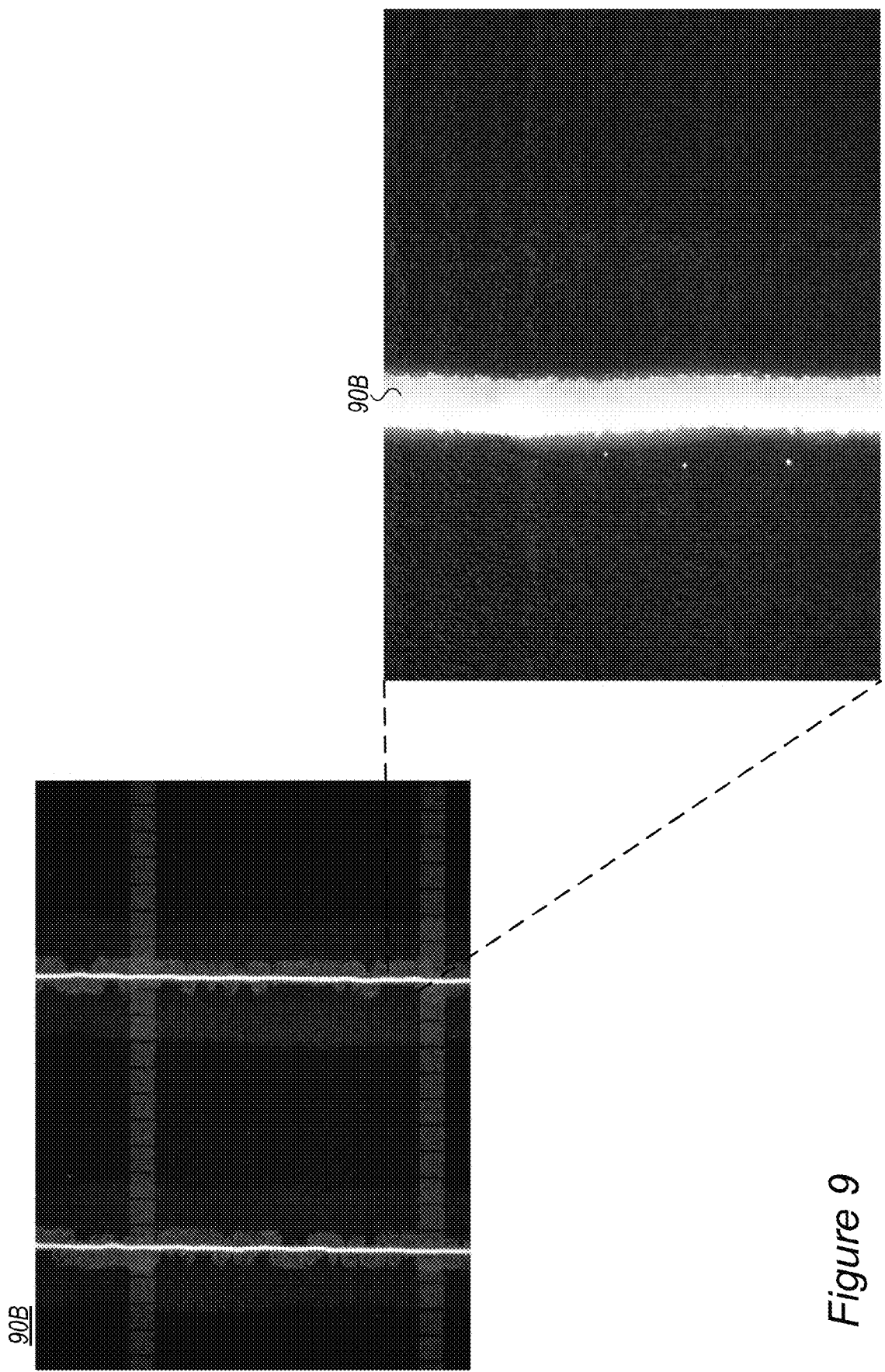

FIG. 9 provides an illustration of fingers printed with dye-mixed paste, using direct dye mixing, according to some embodiments of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Embodiments of the present invention provide efficient and economical methods and mechanisms for conducting a transfer printing process and thereby provide improvements to the technological field of producing electric circuits. Pattern transfer sheets and methods are provided for printing thin paste patterns (e.g., paste fingers) with a high aspect ratio and for increasing throughput in pattern transfer printing. Trenches in the pattern transfer sheets, that are configured to be filled with printing paste and to enable releasing the printing paste from the trenches onto a receiving substrate upon illumination by a laser beam—are coated internally by a coating configured to disintegrate upon the illumination. The coating is configured to enhance the releasing of the paste—increasing throughput and printing quality. The receiving substrate may be cleaned after paste deposition by removing disintegration products of the coating therefrom. Alternatively or complementarily, laser absorbing dye may be mixed into the printing paste to facilitate its release from the trenches.

Advantageously, disclosed pattern transfer sheets and methods enable printing very fine conductive lines having a high aspect ratio on PV cells as well as printing a bump pattern having a high aspect ratio on PCB, printing resistors and capacitors and other printed electronics devices. Disclosed embodiments improve the quality of the printed pattern (e.g., helps avoiding defects), enable reducing the feature width and increase the aspect ratio of the printed features. Certain embodiments also increase throughput of the PTP system by making the printing process quicker.

In certain embodiments, disclosed embodiments enable printing electrode patterns that have a higher aspect ratio and better printing quality compared to prior art technologies, and improve the transfer printing throughput and yield.

Figure 1:
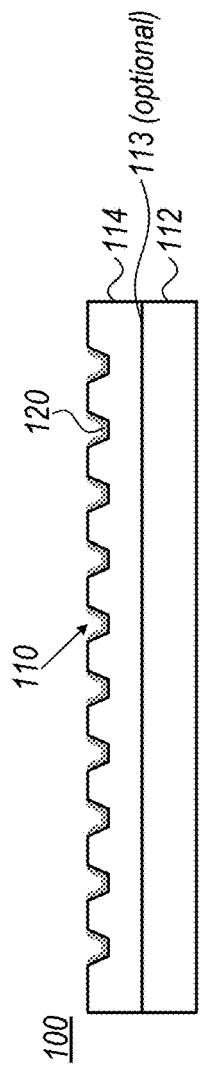

FIG. 1 is a high-level schematic cross-section illustration of a pattern transfer sheet 100, according to some embodiments of the invention. Pattern transfer sheet 100 comprises a plurality of trenches 110 arranged in a specified pattern (pattern not shown and may be of any configuration). Trenches 110 are configured to be filled with printing paste 90 and consecutively enable and support releasing printing paste 90 from trenches 110 onto a receiving substrate 70 upon illumination by a laser beam 80. Furthermore, trenches 110 are coated internally by a coating 120 configured to disintegrate upon illumination 80, to enhance the releasing of paste 90 from trenches 110. Coating 120, also termed releasing layer 120 for its function, may be a thin layer (e.g., be 1-10 μm thick) deposited on pattern transfer sheet 100 as a source substrate or at least into trenches 110 thereof. In some cases, the material(s) of releasing layer 120 (denoted—the releasing material(s)) may be mixed with paste 90 prior to filling the paste into trenches 110. Non-limiting examples for releasing materials include acetone-based ClearWeld™ LD920 series and acrylic resins such as Spectra 390™ by Epolin. In various embodiments, the supporting portion of the pattern transfer sheet 100 may comprise a stretchable substrate with specified stretching properties, such as a polymer substrate, or the supporting portion of the pattern transfer sheet 100 may comprise a rigid substrate, such as a glass substrate.

Coating 120 may comprise organic materials such as NIR absorbing dyes. At least one of the materials for coating 120 is selected to absorb laser illumination 80 used in the PTP process (e.g., laser illumination having a wavelength of 1064 nm). One or more of the materials may be selected to have a maximal absorption at the illumination wavelength. The releasing material(s) may be configured to change phase, evaporate and/or be ablated upon absorption of the laser illumination energy—to yield a thrusting force that pushes paste 90 out of trenches 110 (without changing the shape of the paste) and releases paste 90 onto receiving substrate 70. For example, for using Nd:Yag laser (1060-1085 nm) for illumination 80, coating 120 may comprise NIR (near infrared) absorbing dyes.

Coating 120 may be used to replace or augment the use of volatile components of the paste (e.g., added to evaporate upon illumination and release paste 90). Advantageously, the inventors have found out that using coating 120 enables to print paste patterns (e.g., paste fingers) on receiving substrate 70 with a much higher aspect ratio, e.g., at least 0.7 and up to 1-2—instead of prior art 0.4-0.5; as well as to print extremely narrow finger(s) and/or grid line(s), down to 10 µm wide—instead of prior art above 25-30 µm wide (see, e.g., FIGS. 7A and 7B). Furthermore, avoiding use of volatile compounds in paste 90 broadens the range of printable pastes and makes the process much less sensitive to drying of the paste. Furthermore, although releasing layer 120 is much thinner than paste, a lower laser power is required to release the paste and therefore printing can be carried out at a higher scanning beam velocity, yielding higher system throughput. Finally, using releasing layer 120 makes the printing process more accurate, avoiding printing defects such as paste debris and finger waviness.

Figure 2A:
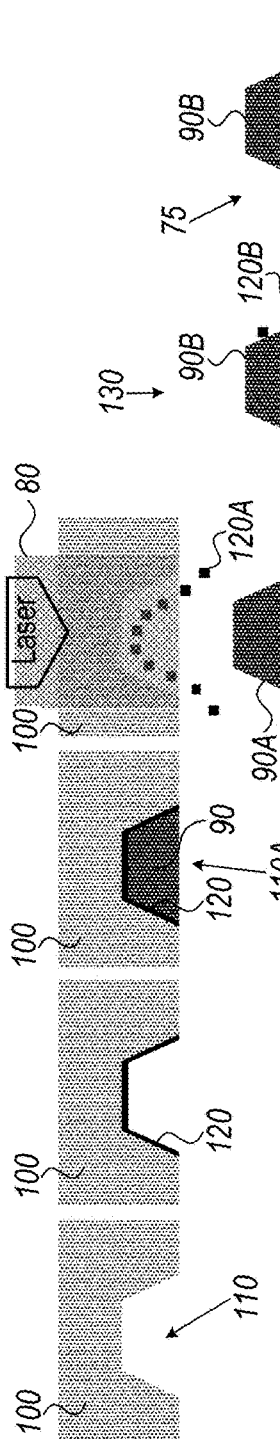
Figure 2B:
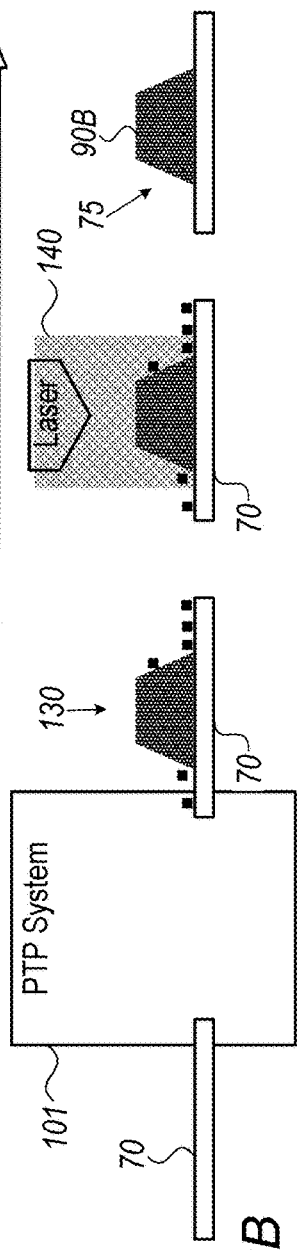

FIGS. 2A and 2B are high-level schematic side-view illustrations of a pattern transfer process utilizing a releasing layer, according to some embodiments of the invention. Trenches 110 in sheet 100 (as source substrate) may be coated internally by coating 120 configured to disintegrate upon illumination 80, to enhance the releasing of paste 90. Coated trenches that are filled with paste are denoted schematically by the numeral 110A. During the releasing of paste 90, coating 120 may disintegrate (indicated schematically by numeral 120A) and be deposited on wafer 70 (as receiving substrate) together with released paste (denoted schematically by numeral 90A). As a result, wafer 70 may comprise released paste (denoted schematically by numeral 90B) and residues (and/or disintegration products) of coating (denoted schematically by numeral 120B)—an intermediate state denoted by numeral 130. Following the pattern transfer process (by PTP system 101), coating residues 120B may be removed from wafer 70, e.g., by high temperature treatment (e.g., firing, sintering and/or drying), which is usually applied for sintering printed metal paste in PV cells manufacturing, or by using illumination 140 to modify and/or remove the residues—to clean the receiving substrate and yield wafer 70 with released paste and without coating disintegration products and residues (the stage being denoted schematically by numeral 75). Illumination 140 may be same as, similar to, or different from illumination 80. In various embodiments, any of the following methods may be used to remove residues 120B of the releasing material: vacuum-assisted vaporization, air blowing, washing and/or wet cleaning.

Specifically, the plurality of trenches in the pattern transfer sheet may be arranged in a specific pattern and be configured to be filled with printing paste. The printing paste may be activated to be released from the trenches onto the receiving substrate upon illumination by a laser beam.

The printing paste layer may contain organic components and solid phase components of metals such as silver, copper, tin, or bismuth that may act as conductive media. The organic components may be selected to provide a specified pressure required to overcome the resistance of the printing paste layer to detaching from the trenches. The specified pressure may be achieved, e.g., by adjusting the content of the organic components in the printing paste layer and/or in the coating inside the trenches, and/or by adjusting the ratio of the solid phase component of the conductive metal medium. For example, in cases the printing paste layer has high viscosity and high damping property when in contact with the inner wall of the trenches, and/or if the content of the solid phase components is high, or the adhesion of organic components is strong, the resistance that the printing paste layer may be relatively large and the corresponding specified pressure may be configured to be larger as well.

Figure 4A:
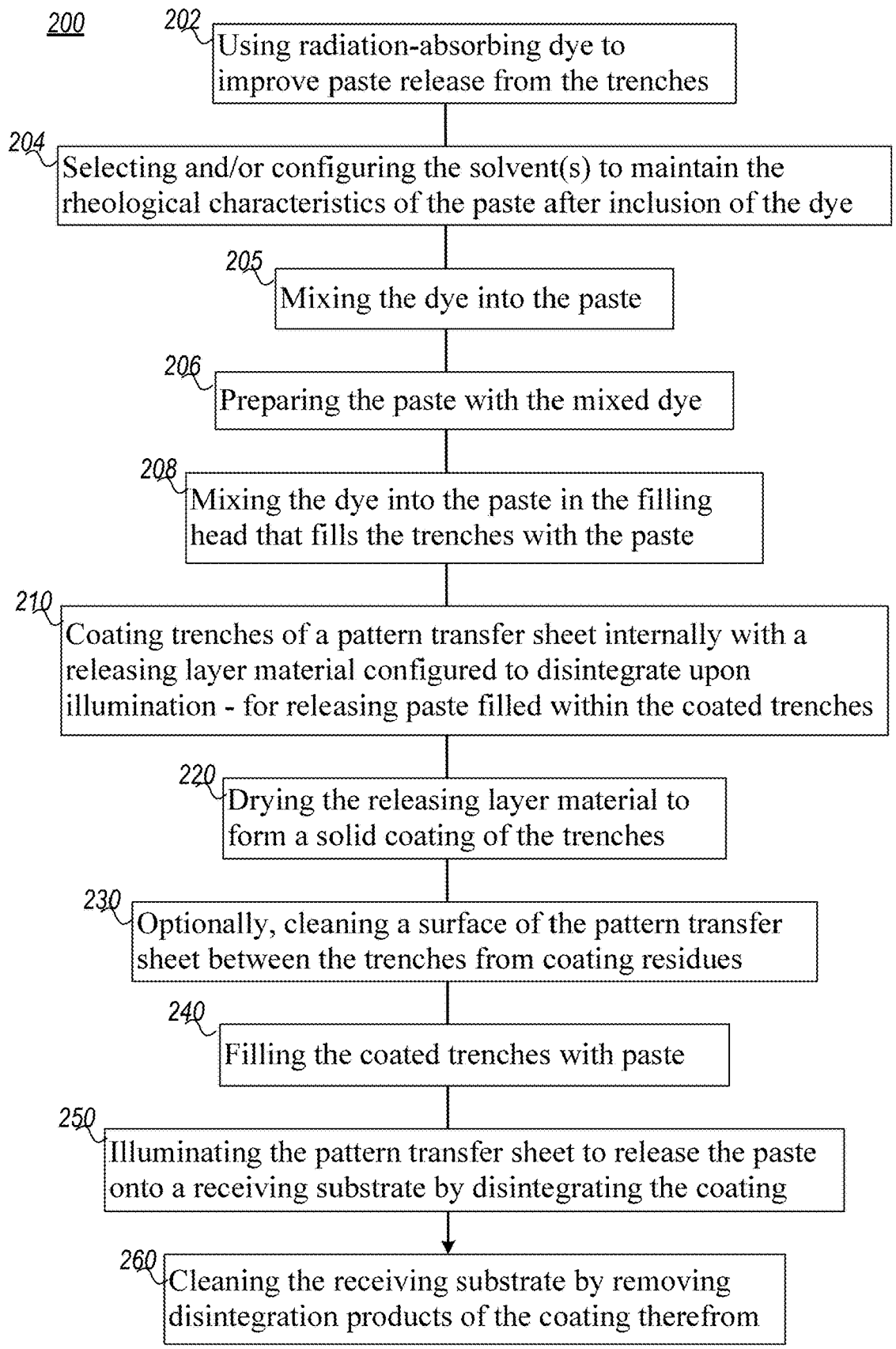

FIGS. 2A and 2B further illustrate schematically a pattern transfer method 200, which is further illustrated in FIG. 4A, comprising coating the trenches with the coating functioning as the releasing layer (stage 210), filling the paste into the coated trenches (stage 240), releasing the paste from the trenches by illumination and disintegration of the releasing layer (stage 250) and cleaning the substrate, if needed, from residues and disintegration products of the releasing layers (stage 260).

In various embodiments, coating residues 120B may be removed by any of the following procedures: high temperature decomposition, selective laser vaporization, vacuum assisted vaporization (reducing the boiling point of coating residues 120B), air blowing and/or solvent washing. Using heat-based procedures to remove coating residues 120B, the coating material may be selected to have decomposition and/or boiling temperatures that do not affect deposited paste 90B (e.g., grid line) and receiving substrate 70. For example, coating material may be selected to have decomposition and/or boiling temperatures that are well below the high sintering temperature of the c-Si PV metallization process (~850° C.), or optionally below the curing temperature for cured pastes (e.g., silver epoxy pastes). For example, the decomposition and/or evaporation temperatures of coating residues 120B may be in the range of 200° C.-300° C. In certain embodiments, same laser illumination 80 used to evaporate layer 120 used to release paste 90 may also be used to evaporate and/or decompose coating residues 120B on wafer 70. It is noted that removing coating residues 120B may be carried out in a single process stage or in two or more process stages, e.g., high temperature decomposition (e.g., by laser illumination 80 and/or in any of an oven, a drying furnace and/or a sintering furnace) followed by low temperature washing or blowing.

The following non-limiting examples disclose NIR absorbing dyes for use with Nd:Yag laser illumination. In addition to the NIR absorbing dyes, coating 120 may further comprise solvents, as well as optionally binders, surface agents and/or viscosity modifiers.

Non-limiting examples for components of NIR absorbing dyes include Diimonium ionic complex(es), Dithiolene complex(es) and/or phthalocyanine. The illustrated Diimonium ionic complex may include, e.g., alkyl chain(s) as one or more residue(s) R and counter ions (not shown) such as $2SbF_6^-$.

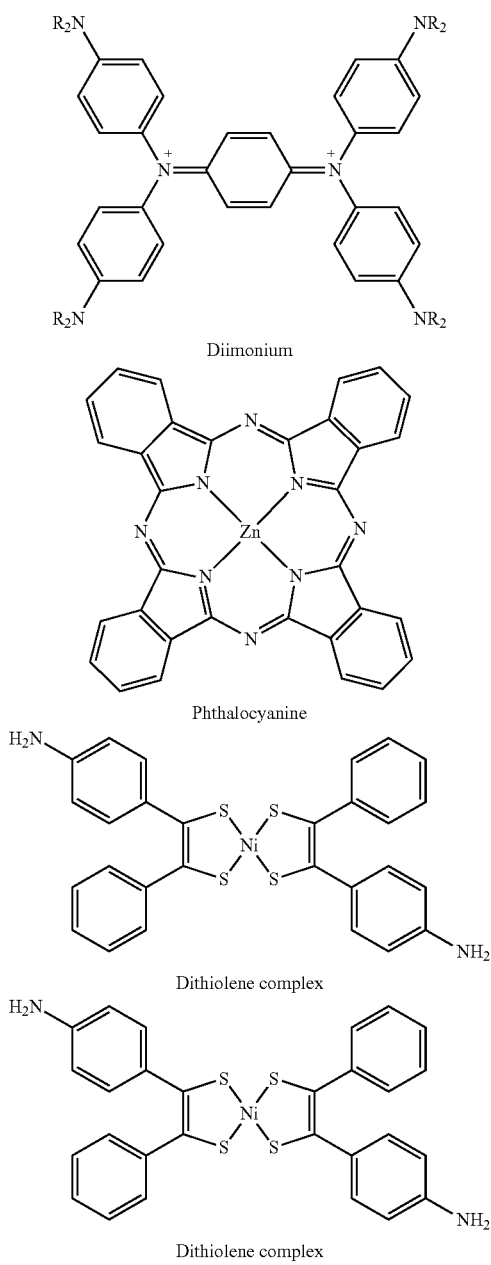

Diimonium

Phthalocyanine

Dithiolene complex

Dithiolene complex

Additional, non-limiting examples for components of NIR absorbing dyes in any of the disclosed embodiments may include any of cyanine (tetramethylindo(di)-carbocyanines) dyes such as, e.g., open chain cyanines ($R_2N^+$=CH[CH=CH]$_n$$^-$NR$_2$), hemicyanines (Aryl=N$^+$=CH[CH=CH]$_n$—NR$_2$), closed chain cyanines (Aryl=N$^+$=CH[CH=CH]$_n$—N=Aryl), neutrocyanines (R2N$^+$=CH[CH=CH]$_n$—CN and $R_2N^+$=CH[CH=CH]$_n$—CHO), e.g., with extended [CH=CH]$_n$ chains, or variants or mixtures thereof; phthalocyanine or naphthalocyanine dyes (comprising four isoindole units linked by a ring of nitrogen atoms) or metal complexes thereof (e.g., with aluminum or zinc), dithiolene metal complexes (having one to three dithiolene ligands), e.g., with nickel, squaraine dyes such as squarylium dye III, quinone analogues, diimonium compounds and azo derivatives, and/or any of their variants, derivatives and/or combinations.

Solvent(s) included in the coating formulation may be selected to dissolve the dye(s) as well as optional binder(s) and additive(s), and may comprise, e.g., acetone, ketones, alcohols, aromatic hydrocarbons and/or glycol ethers solvents.

The coating formulation may further comprise binder(s) comprising polymers and/or polymer precursors for forming coating 120 as a continuous film in trenches 110, such as, e.g., polyvinyl butyral, ethyl-cellulose and/or derivatives thereof, as long as the decomposition temperature of binder(s) is below the paste sintering temperature (e.g., 800° C. for silver pastes 90, or e.g., any of 850° C., 800° C., 750° C., 700° C., 650° C., 600° C., 550° C., 500° C., 450° C., 400° C., 350° C. for silver pastes or other metal pastes or mixtures thereof) or below the paste curing temperature (e.g., 300° C. for silver epoxy pastes 90, or e.g., any of 300° C., 250° C., 200° C. for silver epoxy pastes or other metal pastes). For example, the coating may degrade or decompose at a sintering temperature of the paste that is below 800° C. In another example, the coating may degrade or decompose at a curing temperature of the paste that is below 300° C. Binder(s) may further be selected to minimize the amount of coating residues 120B and/or to simplify the removal thereof.

The coating formulation may further comprise surface wetting additive(s) selected to stabilize the dispersion of the different coating components and/or viscosity modifier(s) selected to support the application of coating 120 in trenches 110. The additive(s) and/or viscosity modifier(s) are selected to have their decomposition temperature below the paste sintering or curing temperature (depending on the type of the paste) and may further be selected to minimize the amount of coating residues 120B and/or to simplify the removal thereof.

In certain embodiments, the solid content of coating 120 may be between 10 wt % and 20 wt % to enable reaching coating 120 which is 1-10 μm thick within trenches 110 that are 20-30 μm deep.

In certain embodiments, the coating formulation or any of its components, such as the NIR absorbing dyes, may be mixed into paste 90, to enhance releasing or possible at least partially replacing coating 120 (e.g., in certain regions of pattern transfer sheet 100). Accordingly, paste 90 may comprise, in addition to commercially available printing pastes (e.g., SOL9651B™ from Heraeus™), NIR absorbing dyes such as Diimonium ionic complex(es), Dithiolene complex(es) and/or phthalocyanine as illustrated herein. It is noted that NIR absorbing dyes may be added to silver pastes and/or to silver epoxy pastes.

Certain embodiments comprise a paste for use in a pattern transfer process (that includes filling the paste into trenches in the polymer pattern transfer sheet which are arranged in a specified pattern, and consecutively releasing the paste from the trenches onto the receiving substrate upon illumination by the laser beam). For example, in case the illumination is in NIR, the paste comprises a releasing material configured to enhance the releasing of the paste from the trenches, with the releasing material comprising at least one NIR absorbing dye comprising at least one of: a Diimonium ionic complex, a Dithiolene complex, phthalocyanine, derivatives, salts and/or combinations thereof. Non-limiting examples include dyes from TCI (Tokyo Chemical Industry, Ltd), Epolight™ 1117 (Tetrakis(decyl)ammonium structure) by Epolin and/or Lunir5™ by Luminochem.

Figure 3A:
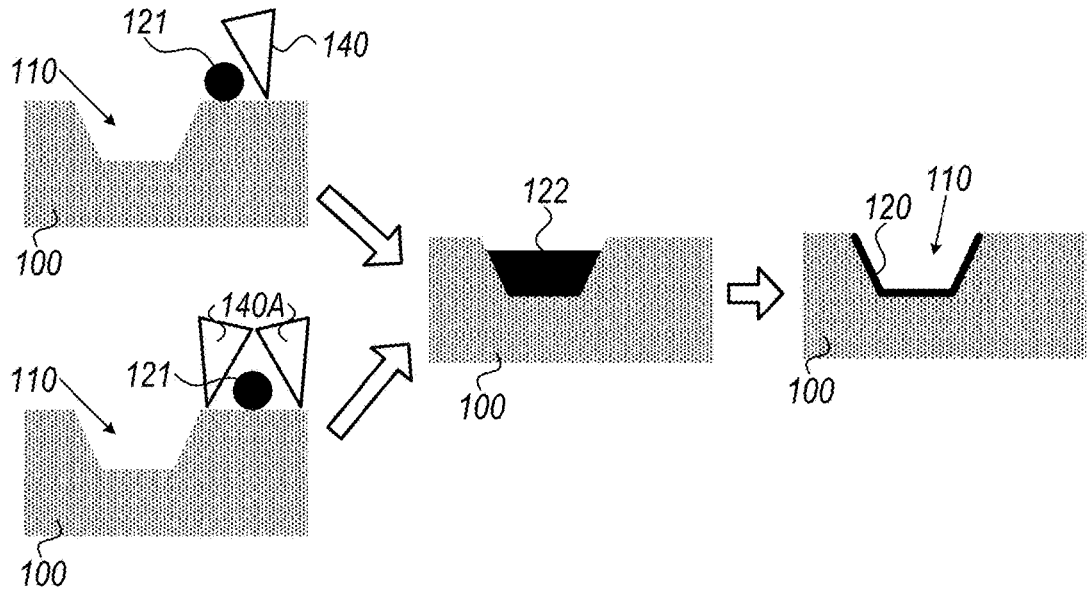
Figure 3B:
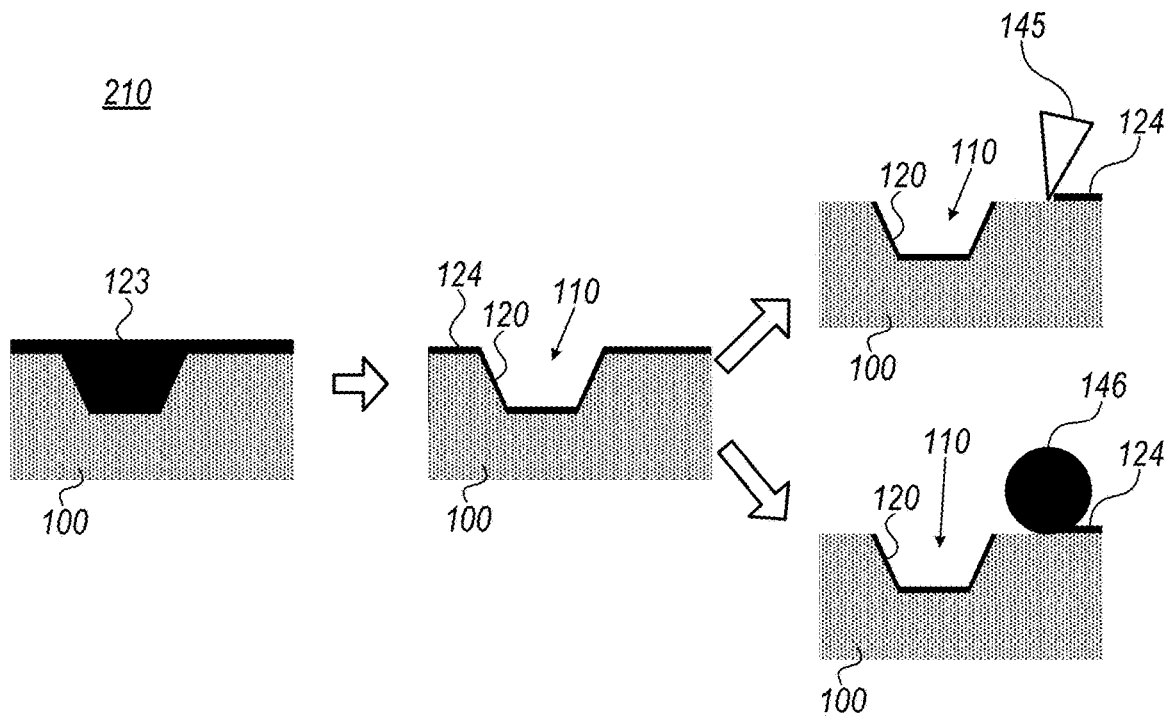

FIGS. 3A and 3B are high-level schematic side-view illustrations of a releasing layer coating process 210, according to some embodiments of the invention. In various embodiments, coating 120, functioning as the releasing layer, may be deposited or applied by any known technique, such as gravure spreading micro gravure spreading, transfer roll spreading, slot (die) extrusion spreading, reverse comma spreading, Mayer rod spreading, doctor blade spreading or other techniques, applied by corresponding coaters.

For example, FIG. 3A illustrates schematically doctor blade coating approaches using at least one blade 140, 140A to fill trenches 110 with a coating solution 121 (shown schematically, denoted by numeral 122 when within trench 110) while keeping the surfaces between trenches 110 clean. After drying coating solution 122, coating 120 is formed within trenches 110 at a thickness determined mainly by the solid content of coating solution 121. Enclosed chamber doctor blade 140A (protecting or enclosing coating solution 121) may be configured to improve control of coating solution 121 and to ensure the cleanliness of the surfaces between the trenches.

Alternatively, or possibly complementarily, FIG. 3B illustrates schematically coating deposition followed by surface cleaning between trenches 110. A coating solution 123 may be applied to the surface of at least a portion of pattern transfer sheet 100, e.g., using a rod spreading technique, spraying, slot extrusion, etc., and drying to form coating 120 as well as residues 124 on the surfaces between trenches 110. Residues 124 may be removed by various methods, such as scraping blade(s) 145 (made, e.g., of metal, plastic, rubber, etc.) set at specified angles, sticky rollers 146, etc.—leaving coating 120 within trenches 110. Removed residues may be recycled.

Any of disclosed coating processes 210 may be carried out in stationary mode (with stationary pattern transfer sheet 100 and respective coating elements moving with respect thereto) and/or in continuous mode (with stationary coating elements and pattern transfer sheet 100 moving with respect thereto, e.g., using rolls in a roll-to-roll approach).

Coating processes 210 may be carried out in advance, before feeding pattern transfer sheet 100 into PTP system 101, or during their movement in PTP system 101, e.g., just before paste filling of the trenches.

In various embodiments, at least the surfaces of trenches 110 may be treated to enhance or control adhesion of coating 120 thereto, using surface treatment techniques such as plasma (e.g., corona), applying silane additives, etc. Surface treatment may be configured to balance between a required coating adhesion within trenches 110, removal of residues from the surfaces between trenches (if needed) and paste release by coating disintegration, as well as by possible sheet recycling considerations.

In various embodiments, PTP system 101 may be configured to inspect and control the coating and cleaning processes, e.g., at a print quality station controlling the printing quality of the fingers (grid lines), to keep the processes within predefined process windows. In certain embodiments, monitoring of residues of releasing materials may be carried out as part of a paste recycling process associated with PTP system 101.

Disclosed sheets 100 may be used to print fine lines of thick metallic paste on silicon wafers, e.g., for photovoltaic (PV) cells as well as to produce electronic circuits by creating conductive lines or pads or other features (e.g., on laminates for PCBs) for printed passive electronic components like resistors or capacitors, or for other printed electronic devices. Other applications may comprise creating conductive features in the manufacturing processes of mobile phones antennas, decorative and functional automotive glasses, semiconductor integrated circuits (IC), semiconductor IC packaging connections, printed circuit boards (PCB), PCB components assembly, optical biological, chemical and environment sensors and detectors, radio frequency identification (RFID) antennas, organic light-emitting diode (OLED) displays (passive or active matrix), OLED illuminations sheets, printed batteries and other applications. For example, in non-limiting solar applications, the metallic paste may comprise metal powder(s), optional glass frits and modifier(s), volatile solvent(s) and non-volatile polymer(s) and/or or resin(s). A non-limiting example for the paste includes SOL9651B™ from Heraeus™.

Filling of the paste into trenches 110 may be carried out by any type of paste-filling head 60 (FIG. 4B, and see, e.g., non-limiting embodiments in Chinese Patent Applications Nos. 202110673006.5 and 202121350578.1 and Israeli Patent Application No. 294060, incorporate herein by reference in their entirety) operating within any type of PTP system 101. The filling process may be controlled to assure continuous and uniform filling of the trenches and marks with paste.

In certain embodiments, pattern transfer sheet 100 may be transparent to laser beam 140 and comprise at least a top polymer layer 114 comprising trenches 110 (illustrated in FIG. 1) embossed, press molded, pneumatically molded or laser molded thereon. In the illustrated non-limiting example, trenches 110 are illustrated as being trapezoid in cross section.

Periodical trenches 110 may comprise trenches, recesses and/or indentations that are embossed (e.g., press molded, pneumatically molded or laser molded) in a similar manner into top polymer layer 114, and may have similar or different profiles. For example, trenches 110 may have various profiles (cross section shapes), such as trapezoid, rounded, square, rectangular and/or triangular profiles. In various embodiments, the pattern of trenches 110 on transfer sheet 100 may comprise continuous trenches 110 and/or arrays of separated dents. It is noted that the term "trenches" is not to be construed as limiting the shape of trenches 110 to linear elements, but is understood in a broad sense to include any shape of trenches 110.

Pattern transfer sheet 100 may further comprise a bottom polymer layer 112 having a melting temperature that is higher than an embossing temperature of top polymer layer 114. In a non-limiting example, top polymer layer 114 may have a melting temperature ($T_m$) below 170° C., below 150° C., below 130° C., below 110° C. (or any intermediate range) in case it is made of semi-crystalline polymer, or a glass temperature ($T_g$) below 160° C., below 140° C., below 120° C., below 100° C. (or any intermediate range) in case it is made of amorphous polymer. The melting temperature of bottom polymer layer 112 may be above the melting point of top polymer layer 114, e.g., above 100° C. (e.g., in case top polymer layer 114 is made of polycaprolactone and has $T_m/T_g$ about 70° C.), above 120° C., above 150° C., above 160° C. (e.g., bi-axially-oriented polypropylene) and up to 400° C. (e.g., certain polyimides), or intermediate values.

In various embodiments, polymer layers 112, 114 may be made of at least one of: polyethylene, polypropylene, polyethylene terephthalate, polybutylene terephthalate, polyethylene naphthalate, fully aromatic polyester, other copolymer polyester, polymethyl methacrylate, other copolymer acrylate, polycarbonate, polyamide, polysulfone, polyether sulfone, polyether ketone, polyamideimide, polyether imide, aromatic polyimide, alicyclic polyimide, fluorinated polyimide, cellulose acetate, cellulose nitrate, aromatic polyamide, polyvinyl chloride, polyphenol, polyarylate, polyphenylene sulfide, polyphenylene oxide, polystyrene, or combinations thereof—as long as top polymer layer 114 has a melting or glass transition temperature ($T_m/T_g$) below the melting or glass transition temperature ($T_m/T_g$) of bottom polymer layer 112 and/or as long as bottom polymer layer 112 is not affected by the processing conditions of top polymer layer 114.

In certain embodiments, the bottom polymer layer 112 and the top polymer layer 114 may be each between 10 μm and 100 μm thick, e.g., between 15 μm and 80 μm thick, between 20 μm and 60 μm thick, between 25 μm and 40 μm thick, or within any intermediate range, with bottom polymer layer 112 being at least as thick as top polymer layer 114. The bottom polymer layer 112 and the top polymer layer 114 may be attached by an adhesive layer 113 thinner than 10 μm (e.g., thinner than 8 μm, thinner than 6 μm, thinner than 4 μm, thinner than 2 μm or having any intermediate thickness), that is transparent to laser beam 80. For example, in certain embodiments, top polymer layer 114 may be thicker than the depth of trenches 110 by several μm, e.g., by 5 μm, by 3-7 μm, by 1-9 μm, or by up to 10 μm. For example, trenches 110 may be 20 μm deep, top polymer layer 114 may be between 20-30 μm thick (e.g., 25 μm thick) and bottom polymer layer 112 may range in thickness between 30 μm and 40 μm (it is noted that thicker bottom polymer layers 112 provide better mechanical performances).

The temperature and thickness of top polymer layer 114 and bottom polymer layer 112 may be designed so that top polymer layer 114 has good molding, ductility and certain mechanical strength, while bottom polymer layer 112 has good mechanical strength. Both top polymer layer 114 and bottom polymer layer 112 may be designed to have good bonding properties.

Elements from FIGS. 1-4B may be combined in any operable combination, and the illustration of certain elements in certain figures and not in others merely serves an explanatory purpose and is non-limiting. It is noted that disclosed values may be modified by at least ±10% of the respective values.

FIG. 4A is a high-level flowchart illustrating a method 200 of monitoring pattern transfer printing, according to some embodiments of the invention. The method stages may be carried out using pattern transfer sheet(s) 100 and/or with respect to PTP systems 101 described above, which may optionally be configured to implement method 200.

Method 200 comprises coating, internally, a plurality of trenches of a pattern transfer sheet (stage 210) with a releasing layer material configured to disintegrate upon illumination for releasing paste filled within the coated trenches. The trenches are configured to be filled with printing paste (see stage 240) and to enable releasing the printing paste from the trenches onto a receiving substrate upon illumination by a laser beam (see stage 250). The coating is configured to disintegrate upon the illumination, to enhance the releasing of the paste.

In certain embodiments, method 200 may comprise carrying out coating 210 by spreading a coating solution (for example having a solid content between 10 wt % and 20 wt %, e.g., 12 wt %, 14 wt %, 16 wt %, 18 wt % or intermediate values, and, e.g., using blade(s), rolls, dies, etc.) and drying the releasing layer to form a solid layer of the trenches (stage 220), e.g., which may range in thickness between 1 μm and 10 μm (for example, 3 μm, 5 μm, 7 μm, 9 μm, or intermediate values). Method 200 may further optionally comprise cleaning a surface of the pattern transfer sheet between the trenches from coating residues (stage 230), e.g., using scraping blade(s) and/or sticky rollers.

Method 200 may further comprise cleaning the receiving substrate by removing disintegration products of the coating therefrom (stage 260), for example by at least one of: high temperature decomposition, selective laser vaporization, vacuum assisted vaporization, air blowing and/or solvent washing. In certain embodiments, cleaning 260 may optionally be carried out by an illumination same as or similar to the illumination used to release the printing paste or by other methods such as firing and/or washing.

Figure 4B:
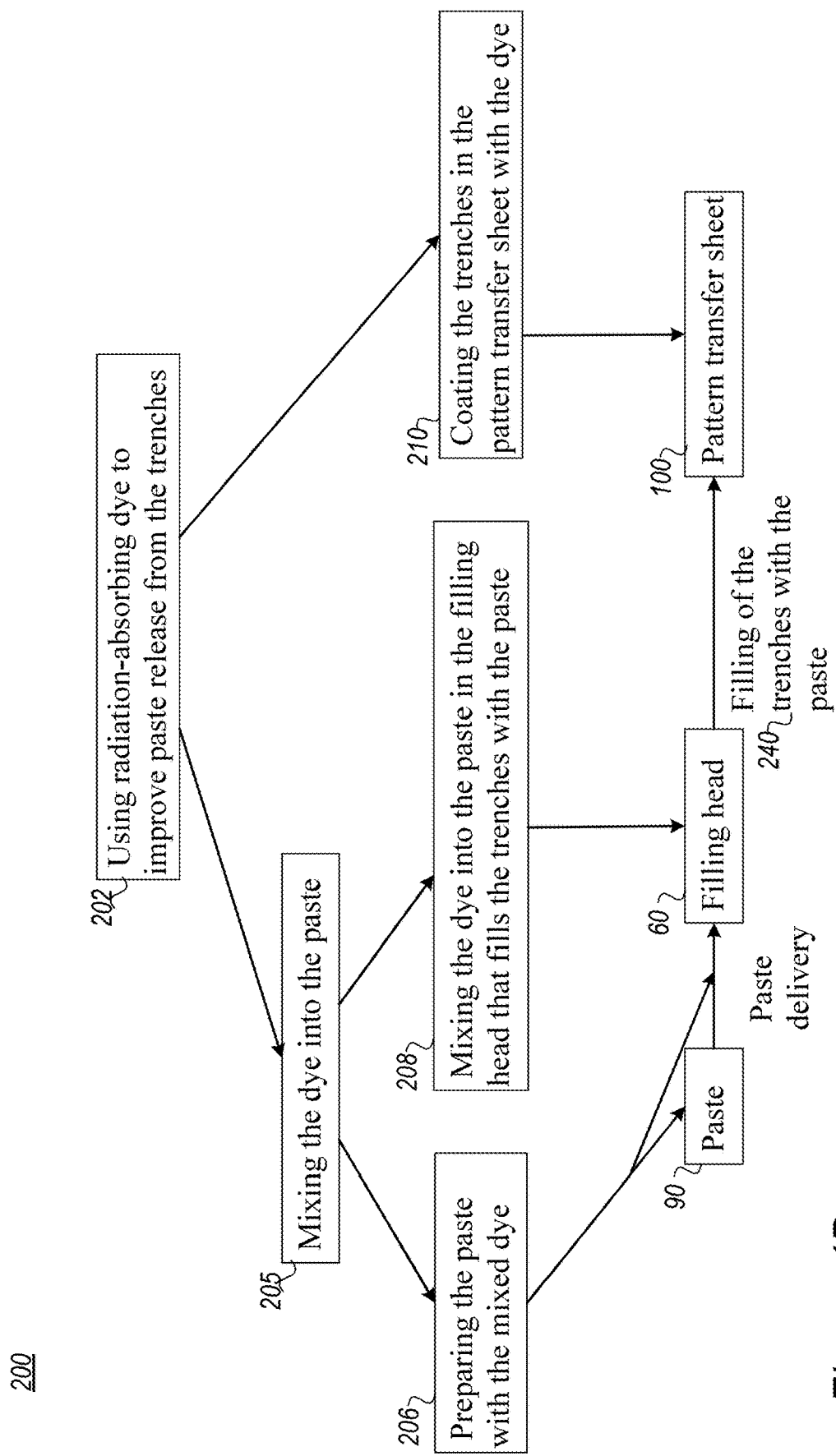

FIG. 4B is a high-level schematic illustration of options for using the dyes in method 200 and in PTP system 101 (specifically with respect to paste-filling head 60), according to some embodiments of the invention. In various embodiments, implementing the disclosed use of radiation-absorbing dye to improve paste release from the trenches (stage 202) may be carried out by mixing the dye into the paste (stage 205 and see further below) and/or coating the trenches in the pattern transfer sheet with the dye (stage 210). Mixing the dye into the paste may be carried out well in advance of filling the trenches, e.g., by preparing the paste with the mixed dye (stage 206) before using filling head 60, e.g., as a preparatory stage or even at a separate facility (indicated schematically by the two distinct arrows) and/or by mixing the dye into the paste in the filling head that fills the trenches with the paste (stage 208). For example, the dye solution may be introduced into a mixer unit in filling head 60 (see, e.g., non-limiting embodiments in Chinese Patent Applications Nos. 202110673006.5 and 202121350578.1 and Israeli Patent Application No. 294060, incorporate herein by reference in their entirety), e.g., using a syringe dispenser located just before the paste mixer, so that the dye solution is uniformly mixed into the printing paste. In such embodiments (208), the amount and/or type of the dye solution may be adjusted with respect to immediate printing requirements, concerning e.g., the working window wafer width, working window marks on the respect sheet segment (see, e.g., Chinese Patent Applications Nos. 2021108029807, 2021216151878, 202111034191X and 2021221306455, as well as U.S. patent application Ser. No. 17/864,419, which are incorporated herein by reference in their entirely), the required and/or resulting printing quality as monitored by PTP system 101 and/or according to any other print quality control methods or devices.

Figures 5A, 5B, 5C:
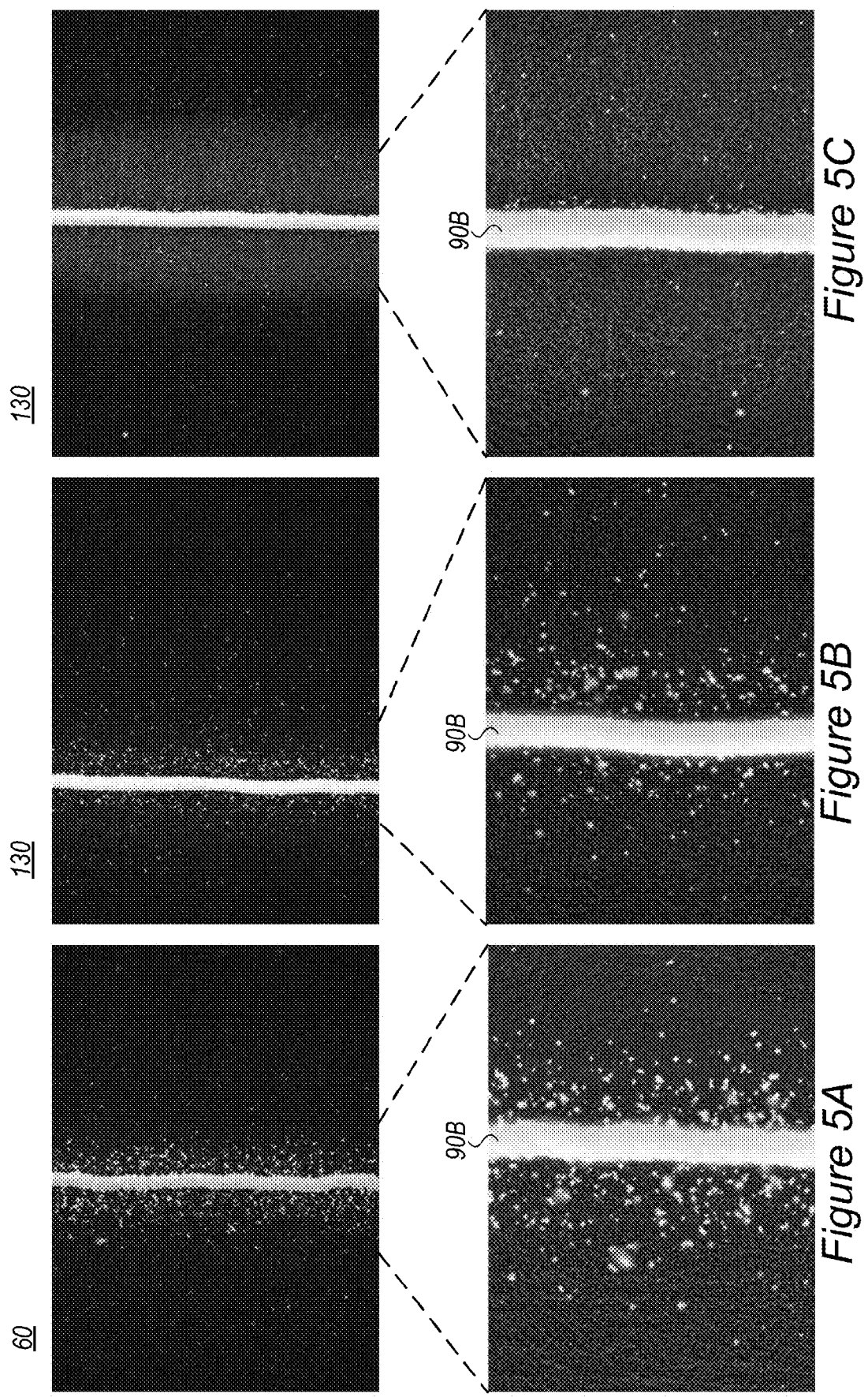

FIGS. 5A-5C illustrate the effect of using coating 120 on the quality of printing and on the residual amount of debris left on the receiving substrate, according to some embodiments of the invention. FIGS. 5A-5C show experimental deposited grid lines 90B with enlarged images showing properties of the grid line itself and surrounding debris (paste and coating residues). The ratios of widths/heights are similar in all three cases, specifically 23 μm/11 μm, 21 μm/14 μm and 24 μm/13 μm, respectively. In FIG. 5A no coating 120 is used and the grid line represents prior art lines 60. FIGS. 5B and 5C illustrate intermediate state 130 after paste release 250 and before substrate cleaning 260 using thin coating 120 (estimated thickness is in the range of 1 μm-3 μm) and thicker coating 120 (estimated thickness is in the range of 3 μm-5 μm), respectively. As seen in FIGS. 5A-5C, both coatings 120 (FIGS. 5B, 5C) reduce the level of debris with respect to uncoated trenches 110 (FIG. 5A), with thick coating 120 (FIG. 5C) more effective than thin coating 120 (FIG. 5B) in reducing the debris around grid line 90B.

Figure 6B:
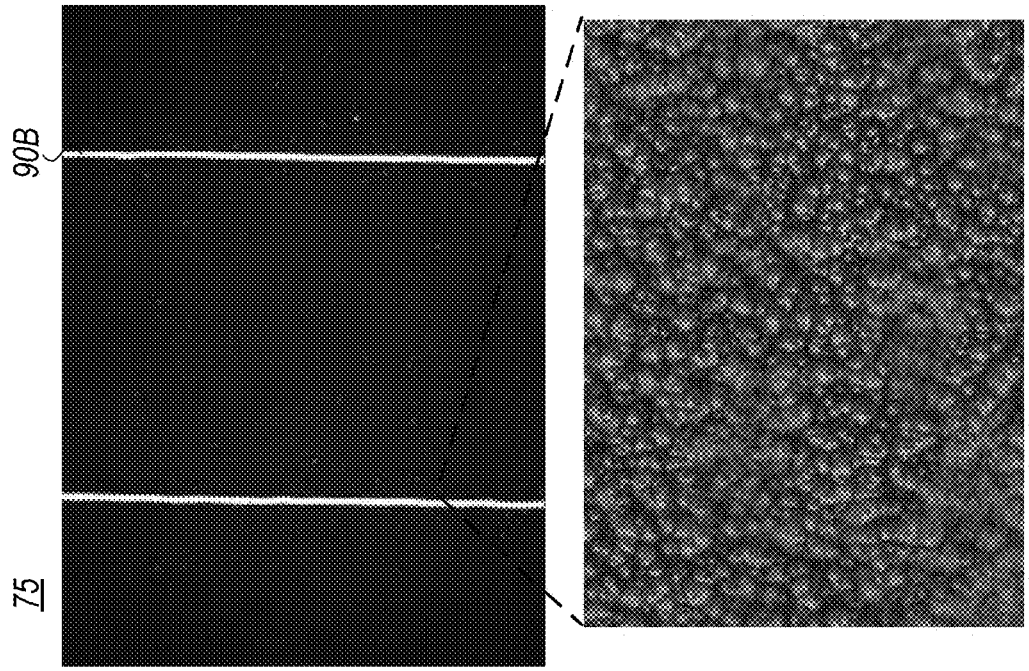
Figure 6A:
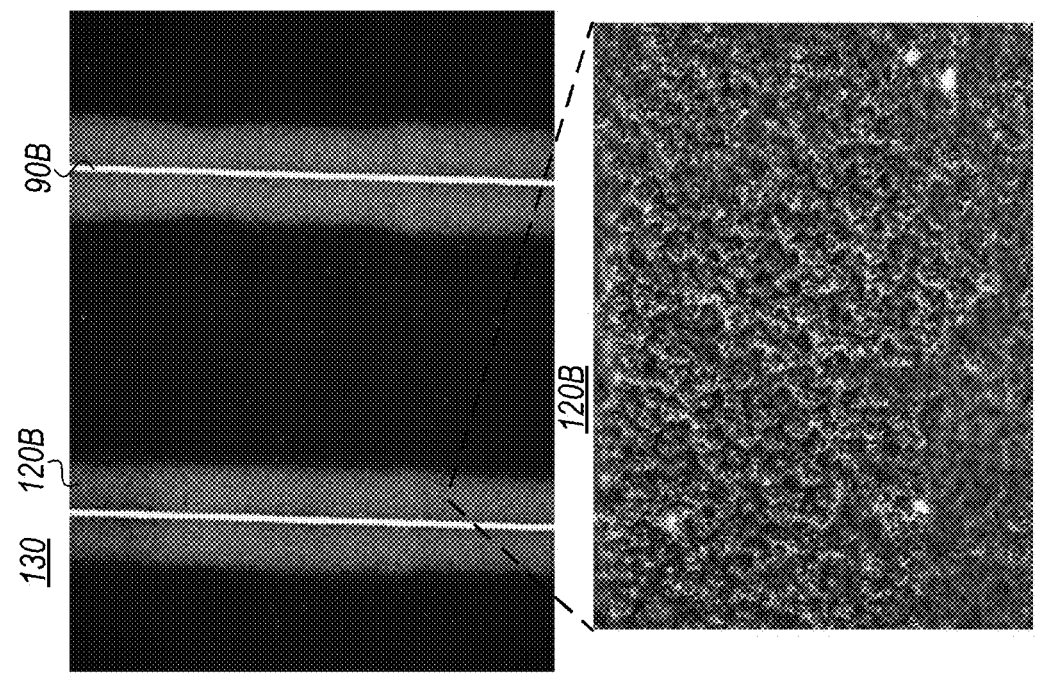

FIGS. 6A and 6B illustrate the effect of substrate cleaning 260 by a heat treatment (at about 250° C.), according to some embodiments of the invention. FIGS. 6A and 6B show deposited grid lines 90B at intermediate state 130 before cleaning 260 and wafers 75 without coating disintegration products and residues after cleaning, respectively, with enlarged images showing surface details. As seen in FIG. 6B, coating residues 120B were removed from the wafer surface by the cleaning procedure.

FIGS. 7A and 7B illustrate the ability to produce extremely thin grid lines 90B using coating 120, according to some embodiments of the invention. Specifically, FIG. 7A illustrates 18 µm wide fingers (grid lines) 90B on wafer 75, with 13 µm height providing an aspect ratio of 0.72—as illustrate in the enlarged image and in the measurement graph; and FIG. 7B illustrates even thinner, 13 µm wide fingers (grid lines) 90B on wafer 75, with 12 µm height providing an aspect ratio of 0.92.

While in some embodiments the releasing material may be provided as separate layer(s) 120 within trenches 110, some embodiments may include mixing a portion of the release material with paste 90 to improve the releasing of paste 90. Mixing releasing material into paste 90 may yield smaller print quality improvement without the addition of the coating process (deposition of coating 120). Disclosed releasing material may be added to provide a few weight percent of paste 90, e.g., between 1-5 wt %. In certain embodiments, both coating 120 and mixing of releasing material into paste 90 may be applied.

Table 1 and FIG. 8 provide experimental results for different mixtures of a dye in acetone solution (20 wt %), with silver (Ag) paste—the former being added to the silver paste at 1 wt %. 2 wt % and 3 wt % (mixture percentage, denoted by the term dye loading), and paste used in different combinations of laser illumination intensity and process working window width (e.g., the effective width of the laser beam) to deposit silver paste fingers. Table 1 further provides the resulting dimensions of the deposited fingers and a qualitative estimation of the level of resulting debris and finger waviness, to indicate print quality. FIG. 8 provides illustrations of the respective fingers 90B printed under the different parameter values, according to some embodiments of the invention. In the printing process a commercial Clearweld 920 dye and a Heraeus SOL9651B paste were used.

TABLE 1

Experimental printing under different mixtures of the dye in the paste and different illumination intensities.

| Dye loading | Laser power | Process working window width | Printed Ag finger dimensions width × height | Level of debris and finger waviness |
|---|---|---|---|---|
| 1 wt % | 150 W | | Not printable | |
| | 200 W | | Not printable | |
| | 250 W | 82 µm | 24 µm × 11 µm | Low |
| | 300 W | 96 µm | 26 µm × 10 µm | High |
| | 350 W | 104 µm | 26 µm × 10 µm | High |
| 2 wt % | 150 W | | Not printable | |
| | 200 W | 82 µm | 24 µm × 11 µm | Low |
| | 250 W | 87 µm | 26 µm × 10 µm | High |
| 3 wt % | 150 W | 94 µm | 24 µm × 12 µm | Low |
| | 200 W | 110 µm | 24 µm × 11 µm | Low |
| | 250 W | 126 µm | 25 µm × 10 µm | Mid |
| | 300 W | 139 µm | 26 µm × 8 µm | High |
| 7 wt % | ≥300 W | | Viscosity too low | High |

In the non-limiting experimental example, optimal printing results were achieved at 3 wt % loading of 20 wt % concertation solution. At high dye loading (7 wt %), the required laser illumination power to reach sufficient working window was high (300 W or more that are absorbed by the dye), resulting in a high level of debris, and the paste viscosity was too low, causing scooping and slumping during paste filling which damaged the correct shapes of the fingers. It is noted however that changes in the dye concentration in the dye-acetone solution (e.g., below 20 wt %), or changes in the dye solution or paste compositions (e.g., different dye, different solvent, different paste) may result in a different optimal dye loading, and any of these parameters may therefore be adjusted in specific implementations.

In various embodiments, the paste solvent may be adjusted to maintain sufficient viscosity after loading the dye (e.g., as a 20 wt % dye in acetone solution, on in other concentrations and/or solvents). For example, two or more different solvents may be combined to control the solubility parameter of the mixed solution—to achieve a specified solution viscosity having a specified solubility parameter (a numerical value that indicates the relative solvency behavior of a specific solvent). For example, using the Hansen solubility parameters (in squared root of pressure units, and related to different types of interactions between the molecules of the two or more solvents, specifically $\delta D$ relating to dispersion forces, $\delta P$ relating to dipole forces, and $\delta H$ relating to hydrogen bonds)—the mixture of solvents may be selected to dissolve the dye(s) and to provide average solubility parameters that correspond to the required solution viscosity and rheological behavior to yield specified paste deposition parameters (such as required aspect ratio and low levels of debris and waviness). For example, two or more solar cell metallization solvents (e.g., of the ether-glycol solvent family, such as butyl carbitol (2-(2-Ethoxyethoxy)ethanol), butyl carbitol acetate, texanol ($C_{12}H_{24}O_3$), alpha-terpineol ($C_{10}H_{18}O$), etc.), having low vapor pressure and slow evaporation/drying any be mixed to provide the required solubility parameter leading to the required paste characteristics when mixed with the dye in acetone solution.

As a non-limiting example, aiming to replace acetone (as solvent for the dye) with a solvent that is a mixture of solar cell metallization solvents and has similar solubility parameters as acetone, Table 2 suggests a non-limiting mixture of butyl carbitol and acetonitrile that approaches the solubility parameter of acetone, and may be used to dissolve the dye while maintain compliance with the parameters required for printing the paste (mixed with the dye). The mixed solution with the dye may be added to an existing paste or used as part of the paste manufacturing.

TABLE 2

A non-limiting example for a solvent mixture for the paste with the dye.

| Solvent | $\delta D$ ($\sqrt{MPa}$) | $\delta P$ ($\sqrt{MPa}$) | $\delta H$ ($\sqrt{MPa}$) |
|---|---|---|---|
| Acetone (Target) | 15.5 | 10.4 | 7 |
| Butyl carbitol | 16 | 7 | 10.6 |
| Acetonitrile | 15.3 | 18 | 6.1 |
| Mixture: 70% butyl carbitol and 30% acetonitrile | 15.79 | 10.3 | 9.25 |

In various embodiments, the mixture of solar cell metallization solvents used for the Ag paste formulations may be configured to have the following ranges of solubility parameters: $\delta D$ may be between 14 and 17 $\sqrt{MPa}$, $\delta P$ may be between 4 and 10 or 11 $\sqrt{MPa}$, and $\delta H$ may be between 7 and 11 $\sqrt{MPa}$. The final solubility parameters of the dye solution may be configured to be within these ranges by means of solvent mixing. As a non-limiting example, Table 3 provides the typical Hansen parameter for common silver paste solvents which may be mixed to yield solvents within the ranges disclosed above.

TABLE 3

Typical Hansen parameter for common silver paste solvents.

| Solvent group | | δD (√MPa) | δP (√MPa) | δH (√MPa) |
|---|---|---|---|---|
| Butyl carbitol | Butyl carbitol | 16 | 7 | 10.1 |
| | Butyl carbitol acetate | 16 | 4.1 | 8.2 |
| Texanol | | 15.1 | 6.1 | 9.8 |
| Alpha-terpineol | | 17 | 5.3 | 10.9 |

Non-limiting examples for NIR absorbing dyes include Diimonium ionic complex(es), Dithiolene complex(es) and/or phthalocyanine as illustrated herein. Non-limiting examples for printing pastes include silver pastes (e.g., SOL9651B™ from Heraeus™), and/or silver epoxy pastes. The dye(s) may be mixed directly with the paste, or mixed as a solution into the paste, with non-limiting examples for the solution including acetone-based ClearWeld™ LD920 series and acrylic resins such as Spectra 390™ by Epolin.

In various embodiments, disclosed paste compositions may include, by weight, 50-90% of silver particles, 1-10% of solvents as disclosed herein, 1-5% of glass frits, 1-5% of polymeric binder, 1-5% of other additives such as viscosity modifiers or surfactants, as well as 1-7% of disclosed dyes, wherein the NIR absorbing dye comprises at least one of: a Diimonium ionic complex, a Dithiolene complex, phthalocyanine, derivatives, or salts and/or combinations thereof.

FIG. 9 provides an illustration of fingers printed with dye-mixed paste, using direct dye mixing, according to some embodiments of the invention. The images are in ×5 and ×50 magnification. In certain embodiments, disclosed paste compositions may include, by weight, 50-90% of silver particles, 1-5% of glass frits, 1-5% of polymeric binder, 1-5% of additives and 0.1-1% of NIR absorbing dye, wherein the NIR absorbing dye comprises at least one of: a Diimonium ionic complex, a Dithiolene complex, phthalocyanine, derivatives, or salts and/or combinations thereof. Direct dye mixing broadens the scope of available dyes, to also include e.g., cyanine derivatives, or salts and/or combinations thereof with other dyes.

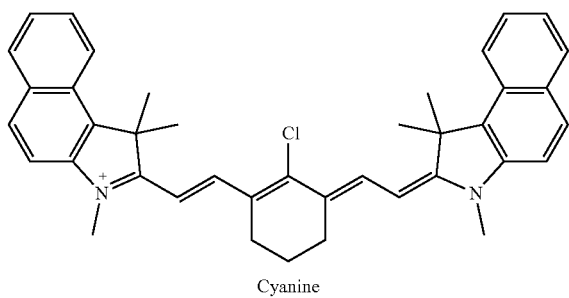

Cyanine

In certain embodiments, 0.1-1% of the NIR absorbing dye may be mixed directly into the printing paste, avoiding the use of solvent. For example, in the illustration, powder NIR dye (LUNIR5 by Luminochem) was mixed with PV silver paste (Heraeus 9681B) using mechanical stirring by a planetary mixer. In the example, 0.6 wt % of the dye was mixed into the paste and printed at 200 W laser illumination intensity, yielding clean and continuous lines. Indeed, direct dye mixing may require lower illumination intensity than printing the paste alone and leave less debris from the releasing process.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A pattern transfer method comprising:
   coating, internally with a coating solution, a plurality of trenches arranged in a specified pattern on a pattern transfer sheet to form a dried coating layer inside each trench of the plurality of trenches, wherein the coating solution is applied only within the trenches,
   filling printing paste into the plurality of trenches, on top of the dried coating layer,
   releasing the printing paste from the plurality of trenches onto a receiving substrate through illumination by a laser beam to yield transferred paste lines having the specified pattern on the receiving substrate,
   wherein the dried coating layer disintegrates upon the illumination, to enhance the releasing of the printing paste, and
   optionally cleaning the receiving substrate by removing disintegration products of the dried coating layer therefrom.

2. The pattern transfer method of claim 1, wherein the coating is carried out by spreading the coating solution having a solid content between 10% and 20% and drying thereof to form the dried coating layer.

3. The pattern transfer method of claim 2, wherein the coating is carried out by at least one of: gravure spreading, micro gravure spreading, transfer roll spreading, slot extrusion spreading, reverse comma spreading, Mayer rod spreading and doctor blade spreading.

4. The pattern transfer method of claim 1, further comprising cleaning the receiving substrate by removing disintegration products of the dried coating layer therefrom, by at least one of: high temperature decomposition at a temperature of 200° C. to 300° C., selective laser vaporization, vacuum assisted vaporization, air blowing, solvent washing and/or by an illumination that is the same as the illumination used to release the printing paste.

5. The pattern transfer method of claim 1, wherein the dried coating layer comprises at least one organic-based dye selected to absorb the illumination.

6. The pattern transfer method of claim 5, wherein the illumination is in near infrared (NIR) and the at least one organic-based dye comprises at least one NIR absorbing dye comprising at least one of: a Diimonium ionic complex, a Dithiolene complex, phthalocyanine, derivatives, salts and/or combinations thereof.

7. The pattern transfer method of claim 1, further comprising sintering the released printing paste on the receiving substrate at a sintering temperature that is any of: 850° C., 800° C., 750° C., 700° C., 650° C., 600° C., 550° C., 500° C., 450° C., 400° C. or 350° C., wherein disintegration products of the dried coating layer degrade or decompose below the sintering temperature.

8. The pattern transfer method of claim 1, further comprising curing the released printing paste on the receiving substrate at a curing temperature that is any of: 300° C., 250° C. or 200° C., wherein disintegration products of the dried coating layer degrade or decompose below the curing temperature.

9. The pattern transfer method of claim 1, wherein the dried coating layer is 1-10 μm thick.

10. The pattern transfer method of claim 1, wherein the pattern transfer sheet is transparent to the illumination by the laser beam, and the plurality of trenches are formed into the pattern transfer sheet by press molding, pneumatic molding, laser molding or embossing.

11. The pattern transfer method of claim 1, wherein a cross section of the plurality of trenches in the pattern transfer sheet is any of: trapezoid, rectangular, rounded or triangular.

12. The pattern transfer method of claim 1, wherein the pattern transfer sheet comprises at least one polymer layer which is made of at least one of: polyethylene, polypropylene, polyethylene terephthalate, polybutylene terephthalate, polyethylene naphthalate, fully aromatic polyester, aromatic-aliphatic copolyester, copolymer acrylate, polycarbonate, polyamide, polysulfone, polyether sulfone, polyether ketone, polyamideimide, polyether imide, aromatic polyimide, alicyclic polyimide, fluorinated polyimide, cellulose acetate, cellulose nitrate, aromatic polyamide, polyvinyl chloride, polyphenol, polyarylate, polyphenylene sulfide, polyphenylene oxide, or polystyrene.

13. The pattern transfer method of claim 1, wherein the pattern transfer sheet comprises at least:
a top polymer layer comprising the plurality of trenches, and
a bottom polymer layer having a melting temperature that is higher than an embossing temperature of the top polymer layer.

14. The pattern transfer method of claim 13, wherein the top polymer layer has a melting temperature below 170° C. in case it is made of semi-crystalline polymer, or a glass transition temperature below 160° C. in case it is made of amorphous polymer.

15. The pattern transfer method of claim 13, wherein the top polymer layer has a melting temperature below 110° C. in case it is made of semi-crystalline polymer, or a glass transition temperature below 100° C. in case it is made of amorphous polymer.

16. The pattern transfer method of claim 13, wherein the top polymer layer and the bottom polymer layer are each between 10 μm and 100 μm thick, are attached by an adhesive layer thinner than 10 μm that is transparent to the illumination by the laser beam, and wherein the bottom polymer layer is at least as thick as the top polymer layer.

17. The pattern transfer method of claim 13, wherein the top polymer layer and the bottom polymer layer are each between 25 μm and 40 μm thick, are attached by an adhesive layer thinner than 2 μm that is transparent to the illumination by the laser beam, and wherein the bottom polymer layer is at least as thick as the top polymer layer.

* * * * *